United States Patent
Sugawara

(10) Patent No.: US 8,319,543 B2
(45) Date of Patent: Nov. 27, 2012

(54) DIFFERENTIAL AMPLIFIER ON SEMICONDUCTOR INTEGRATED CIRCUIT

(75) Inventor: Mariko Sugawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 176 days.

(21) Appl. No.: 12/868,517

(22) Filed: Aug. 25, 2010

(65) Prior Publication Data

US 2011/0050329 A1    Mar. 3, 2011

(30) Foreign Application Priority Data

Aug. 25, 2009   (JP) .................................. 2009-194104

(51) Int. Cl.
*H03K 3/01*   (2006.01)
(52) U.S. Cl. .................................................... 327/534
(58) Field of Classification Search .................... 327/534
See application file for complete search history.

(56) References Cited

U.S. PATENT DOCUMENTS

| | | | |
|---|---|---|---|
| 5,099,146 A * | 3/1992 | Miki et al. ........................ | 327/77 |
| 5,682,118 A * | 10/1997 | Kaenel et al. .................. | 327/534 |
| 5,883,544 A * | 3/1999 | So et al. ......................... | 327/537 |
| 5,912,591 A | 6/1999 | Yamada | |
| 6,147,508 A * | 11/2000 | Beck et al. ...................... | 326/32 |
| 6,313,691 B1 * | 11/2001 | Podlesny et al. .............. | 327/534 |
| 6,518,827 B1 * | 2/2003 | Fifield et al. .................. | 327/534 |
| 6,809,968 B2 * | 10/2004 | Marr et al. ................. | 365/185.24 |
| 7,596,013 B2 | 9/2009 | Yamaoka et al. | |
| 7,999,603 B2 * | 8/2011 | Sumita et al. .................. | 327/534 |

FOREIGN PATENT DOCUMENTS

| | | |
|---|---|---|
| JP | 8-139579 A | 5/1996 |
| JP | 9-129831 A | 5/1997 |
| JP | 10-229166 A | 8/1998 |
| JP | 2006-279599 A | 10/2006 |
| JP | 2008-152855 A | 7/2008 |
| JP | 2008-236515 A | 10/2008 |

* cited by examiner

*Primary Examiner* — Kenneth B. Wells

(74) *Attorney, Agent, or Firm* — Fujitsu Patent Center

(57) ABSTRACT

A semiconductor integrated circuit includes a cascode circuit having a transistor, a detector circuit and a bias generator circuit. A bias is applied to a substrate of the transistor. The detector circuit generates a signal related to a threshold voltage of the transistor. The bias generator circuit generates the bias based on the signal generated by the detector circuit.

13 Claims, 13 Drawing Sheets

|  | A | Vth | B |
|---|---|---|---|
| TYP | 0.74 | 0.64 | 0.10 |
| SS | 0.74 | 0.74 | 0.00 |
| FF | 0.74 | 0.50 | 0.24 |

US 8,319,543 B2

DIFFERENTIAL AMPLIFIER ON SEMICONDUCTOR INTEGRATED CIRCUIT

CROSS-REFERENCE TO RELATED APPLICATIONS

This application is based upon and claims the benefit of priority of the prior Japanese Patent Application No. 2009-194104, filed on Aug. 25, 2009, the entire contents of which are incorporated herein by reference.

FIELD

Embodiments discussed herein relate to semiconductor integrated circuits.

BACKGROUND

Recently, the speed and channel capacity of communication networks have been steadily increasing. The scale of circuits performing amplification and waveform-shaping of high-speed electrical signals exchanged over such communication network tends to increase. On the other hand, there is a need to decrease power consumption of the circuits. Thus, strict conditions are imposed on design of such circuits. Meanwhile, to perform amplification and waveform-shaping of high-speed electrical signals, such circuits often have, for example, a multi-stage configuration in which a plurality of amplifier circuits are connected in series (see, for example, Japanese Unexamined Patent Application Publication Nos. 2008-236515 and 2006-279599).

However, in the foregoing related art, when threshold voltages of transistors in circuits fluctuate because of process variation of the transistors, the fluctuation unfortunately decreases a margin of circuit design. The fluctuation of the threshold voltages of the transistors makes direct-current (DC) potential design difficult particularly in semiconductor integrated circuits achieving both the amplification and waveform-shaping of high-speed electronic signals and the decrease in power consumption.

SUMMARY

According to an aspect of the invention, a semiconductor integrated circuit includes a cascode circuit having a transistor, a detector circuit and a bias generator circuit. A bias is applied to a substrate of the transistor. The detector circuit generates a signal related to a threshold voltage of the transistor. The bias generator circuit generates the bias based on the signal generated by the detector circuit.

Advantages of the invention will be realized and attained via the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Embodiments of the invention will be described below with reference to the accompanying drawings.

First Embodiment

Figure 1:
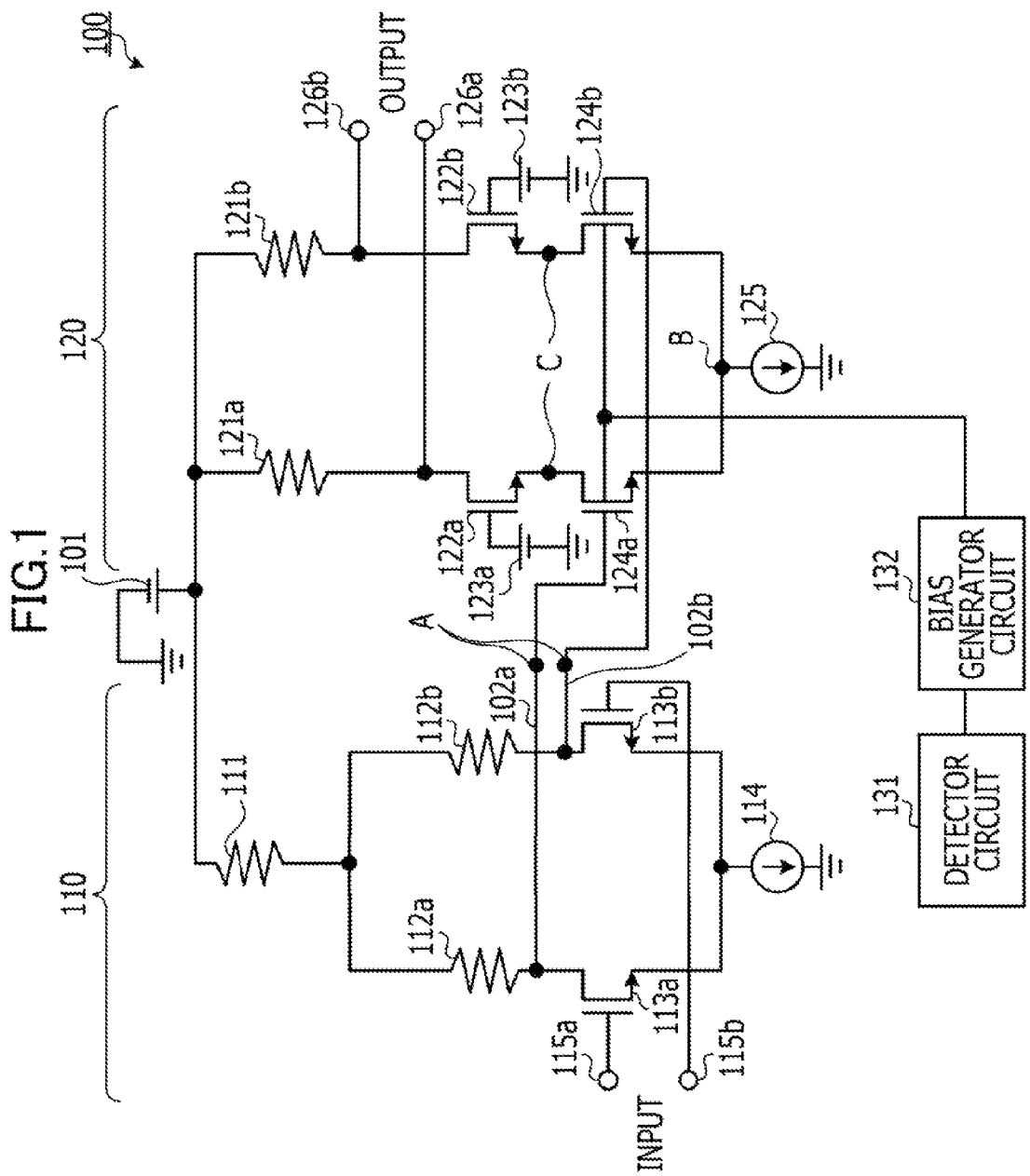
FIG. 1 is a circuit diagram illustrating a semiconductor integrated circuit according to a first example embodiment of the invention.

FIG. 1 is a circuit diagram illustrating a semiconductor integrated circuit according to a first embodiment. As illustrated in FIG. 1, a semiconductor integrated circuit 100 according to the first embodiment includes a power supply 101, a path 102a, a path 102b, a first amplifier circuit 110, a second amplifier circuit 120, a detector circuit 131, and a bias generator circuit 132. The power supply 101 supplies voltage to the first amplifier circuit 110 and the second amplifier circuit 120. A signal amplified by the first amplifier circuit 110 is supplied to the second amplifier circuit 120 through the paths 102a and 102b.

The first amplifier circuit 110 includes a resistor 111, resistors 112a and 112b, transistors 113a and 113b, a current source 114, and input terminals 115a and 115b. One end of the resistor 111 is connected to the power supply 101, whereas the other end thereof is connected to the resistors 112a and 112b. One end of the resistor 112a is connected to the resistor 111, whereas the other end thereof is connected to a drain of the transistor 113a. One end of the resistor 112b is connected to the resistor 111, whereas the other end thereof is connected to a drain of the transistor 113b.

The transistors 113a and 113b are included in a differential pair. The drain of the transistor 113a is connected to the resistor 112a. A source of the transistor 113a is connected to the current source 114, whereas a gate of the transistor 113a is connected to the input terminal 115a. The drain of the transistor 113b is connected to the resistor 112b. A source of the transistor 113b is connected to the current source 114, whereas a gate of the transistor 113b is connected to the input terminal 115b.

One end of the current source 114 is connected to the sources of the transistors 113a and 113b, whereas the other end thereof is connected to ground. The path 102a to the second amplifier circuit 120 is connected between the resistor 112a and the transistor 113a. The path 102b to the second amplifier circuit 120 is connected between the resistor 112b and the transistor 113b.

Signals input from the input terminals 115a and 115b are applied to the gates of the transistors 113a and 113b, respectively. In accordance with the input signals, current flowing from the resistors 112a and 112b to the current source 114 is generated. Accordingly, amplified signals are output to the second amplifier circuit 120 through the paths 102a and 102b.

The second amplifier circuit 120 includes resistors 121a and 121b, transistors 122a and 122b, power supplies 123a and 123b, transistors 124a and 124b, a current source 125, and output terminals 126a and 126b. One end of the resistor 121a is connected to the power supply 101, whereas the other end thereof is connected a drain of the transistor 122a. One end of the resistor 121b is connected to the power supply 101, whereas the other end thereof is connected to a drain of the transistor 122b.

The transistors 122a and 122b are included in a differential pair. The drain of the transistor 122a is connected to the resistor 121a. A source of the transistor 122a is connected to a drain of the transistor 124a, whereas a gate of the transistor 122a is connected to the power supply 123a. The drain of the transistor 122b is connected to the resistor 121b. A source of the transistor 122b is connected to a drain of the transistor 124b, whereas a gate of the transistor 122b is connected to the power supply 123b.

The transistors 124a and 124b are included in a differential pair. The drain of the transistor 124a is connected to the source of the transistor 122a. A source of the transistor 124a is connected to the current source 125, whereas a gate of the transistor 124a is connected to the path 102a. The drain of the transistor 124b is connected to the source of the transistor 122b. A source of the transistor 124b is connected to the current source 125, whereas a gate of the transistor 124b is connected to the path 102b.

Each of the transistors 124a and 124b may be, for example, a metal oxide semiconductor (MOS) transistor. Additionally, each of the transistors 113a, 113b, 122a, and 122b may be, for example, a MOS transistor. A bias (substrate bias) output from the bias generator circuit 132 is applied to substrates of the transistors 124a and 124b.

The output terminal 126a is connected between the resistor 121a and the drain of the transistor 122a. The output terminal 126b is connected between the resistor 121b and the drain of the transistor 122b. Signals output from the first amplifier circuit 110 are applied to the gates of the transistors 124a and 124b through the paths 102a and 102b, respectively. In accordance with the signals from the first amplifier circuit 110, current flowing from the resistors 121a and 121b to the current source 125 is generated. Accordingly, amplified signals are output from the output terminals 126a and 126b.

The transistors 122a and 122b and the power supplies 123a and 123b are inserted so that the transistors 124a and 124b form cascode configurations, respectively, whereby an operation speed of the second amplifier circuit 120 is increased. In the cascode configurations, the transistor 122a is stacked with the transistor 124a and the transistor 122b is stacked with the transistor 124b. In this case, potential voltages (hereafter, "potentials") at points (called out by the label "C" in FIG. 1) between the transistors 122a and 124a and between the transistors 122b and 124b are lower than those at the output terminals 126a and 126b, respectively.

To acquire a drain voltage sufficient for driving the transistors 124a and 124b, a point (point B) between the current source 125 and the transistors 124a and 124b is designed to have a low potential. More specifically, the potential at the point B is lower than potentials (gate voltages of the transistors 124a and 124b) at points (points A) in the paths 102a and 102b by threshold voltages $V_{th}$ of the transistors 124a and 124b, respectively. The threshold voltage $V_{th}$ corresponds to a gate voltage for allowing current to flow between the source and the drain.

The resistor 111 is inserted on a downstream side of the power supply 101 in the first amplifier circuit 110 so that the point B has a low potential. For example, when the power supply 101 has a supply voltage of 1.2 V, a DC potential $V_a$ at the points A can be represented by Equation (1) using a resistance value $R_c$ of the resistor 111, a resistance value $R_o$ of the resistors 112a and 112b, and a current value $I_{ref}$ of the current source 114.

$$V_a = 1.2 - (I_{ref} \times Rc) - \left(\frac{I_{ref}}{2} - R_o\right) \quad (1)$$

When the resistance value Rc of the resistor 111, the resistance value Ro of the resistors 112a and 112b, and the current value Iref of the current source 114 are, for example, equal to 8 ohms, 30 ohms, and 20 mA, respectively, in Equation (1), the DC potential Va at the points A is equal to 0.74 V. When the threshold voltage Vth of each of the transistors 124a and 124b is equal to 0.64 V, the potential at the point B is equal to 0.1 V. Accordingly, little margin is left in low DC potential design at the point B.

In such a configuration, if the threshold voltage $V_{th}$ of each of the transistors 124a and 124b fluctuates because of process variation, the fluctuation decreases the margin in the DC potential design at the point B. For example, if the threshold voltages $V_{th}$ of the transistors 124a and 124b increase because of process variation, the potential at the point B approaches 0 V, and a voltage for driving the current source 125 becomes insufficient. Accordingly, the DC potential design of the second amplifier circuit 120 fails.

However, in the semiconductor integrated circuit 100, the detector circuit 131 and the bias generator circuit 132 compensate the fluctuation of the threshold voltages $V_{th}$ of the transistors 124a and 124b due to process variation. More specifically, the detector circuit 131 detects the threshold voltages of the transistors 124a and 124b and then outputs a signal indicative thereof as a detection result to the bias generator circuit 132.

The bias generator circuit 132 generates a bias on the basis of the detection result supplied from the detector circuit 131. The bias generator circuit 132 outputs the generated bias. The bias output from the bias generator circuit 132 is applied to a substrate of each of the transistors 124a and 124b. A substrate bias effect occurs in the transistors 124a and 124b in response to application of the bias to the substrates of the transistors 124a and 124b, respectively.

More specifically, changes in widths of depletion layers of the transistors 124a and 124b change substantial threshold voltages of the transistors 124a and 124b, respectively. In this manner, the fluctuation of the threshold voltages $V_{th}$ of the transistors 124a and 124b due to process variation can be compensated. Thus, for example, the margin (e.g., a measure of the difference between a worst-case performance of a design and a performance goal for the design) can be increased in DC potential design at the point B.

Figure 2:
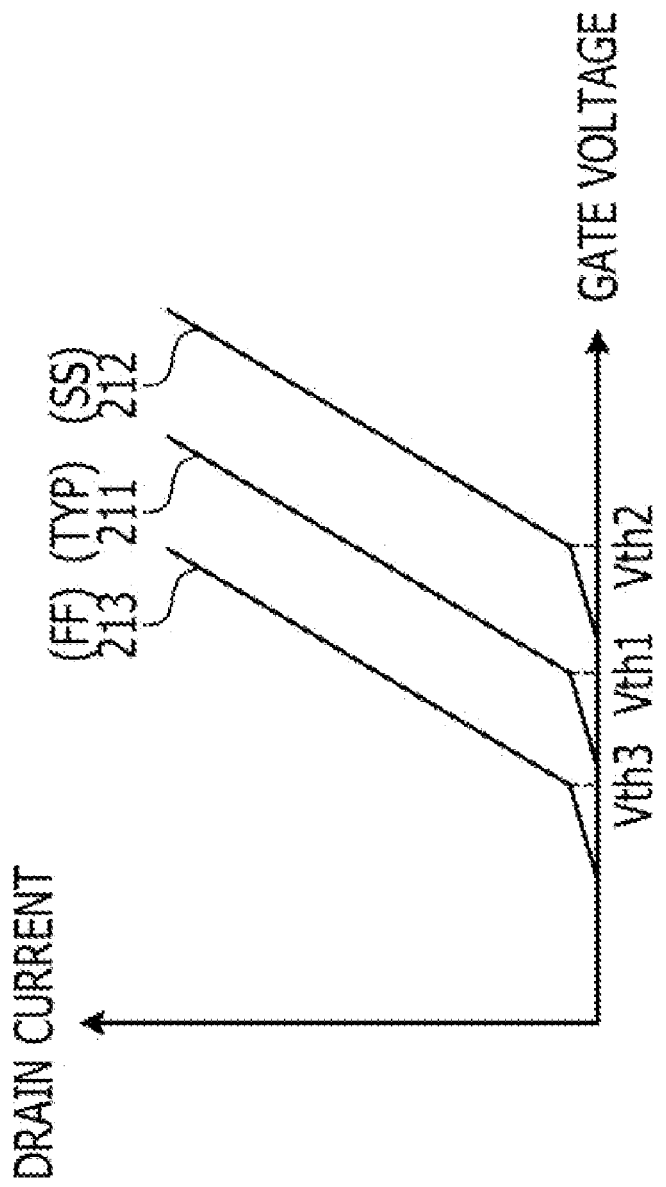
FIG. 2 is a graph illustrating an example of fluctuations of a threshold voltage of a transistor due to process variation.

FIG. 2 is a graph illustrating an example of fluctuations of a threshold voltage of a transistor due to process variation. In semiconductor manufacturing, a process corner is an example of a design-of-experiments (DoE) technique that refers to a variation of fabrication parameters used in applying an integrated circuit design to a semiconductor wafer. Process corners represent extreme instances of these parameter variations within which a circuit that has been etched onto the wafer should function correctly. A circuit running on devices fabricated at these process corners may run slower or faster than specified and at lower or higher temperatures and voltages, but if the circuit does not function at all at any of these process extremes then the design is considered to have inadequate design margin. Referring to FIG. 2, the horizontal axis represents a voltage (gate voltage) applied to the gate of each of the transistors 124a and 124b, whereas the vertical axis represents current (drain current) flowing through the drain of each of the transistors 124a and 124b.

One naming convention for process corners uses two-letter designators, where the first letter refers to the NMOS corner, and the second letter refers to the PMOS corner. In FIG. 2, a line 211 represents a characteristic of the drain current against the gate voltage of the transistors 124a and 124b resulting from a typical-typical (TT) process corner, namely a corner without substantial process variation, i.e., a corner that does not exhibit substantial process variation. A line 212 represents a characteristic of the drain current against the gate voltage of the transistors 124a and 124b resulting from a slow-slow (SS) process corner. A line 213 represents a characteristic of the drain current against the gate voltage of the transistors 124a and 124b resulting from a fast-fast (FF) process corner.

A value Vth1 represents the threshold voltage $V_{th}$ (reference threshold voltage) of each of the transistors 124a and 124b resulting from the process TT. A value Vth2 represents the threshold voltage $V_{th}$ of each of the transistors 124a and 124b resulting from the process SS. A value Vth3 represents the threshold voltage $V_{th}$ of each of the transistors 124a and 124b resulting from the process FF.

As illustrated by the lines 211-213, the characteristic of the drain current against the gate voltage fluctuates because of the process variation (the processes TT, SS, and FF) of the transistors 124a and 124b. With this fluctuation of the characteristic, the threshold voltage $V_{th}$ of each of the transistors 124a and 124b also fluctuates as shown by the values Vth1-Vth3.

Figure 3:
FIG. 3 is a diagram illustrating an example of a potential value at each point of a semiconductor integrated circuit affected by process variation.

FIG. 3 is a diagram illustrating an example of a potential value at each point of a semiconductor integrated circuit affected by process variation. In a table 300 illustrated in FIG. 3, a column "$V_{th}$" shows the threshold voltage $V_{th}$ of each of the transistors 124a and 124b illustrated in FIG. 1. A column "A" shows potential values at the points A (see FIG. 1) of the semiconductor integrated circuit 100. A column "B" shows potential values at the point B (see FIG. 1) of the semiconductor integrated circuit 100. For example, when the semiconductor integrated circuit 100 is fabricated in the process TT, the threshold voltage $V_{th}$ is equal to 0.64 V (reference threshold voltage).

When the semiconductor integrated circuit 100 is fabricated in the process SS, the threshold voltage $V_{th}$ is, for example, equal to 0.74V, which is higher than the reference threshold voltage. The potential value at the point B of the semiconductor integrated circuit 100 is, for example, equal to 0.00 V, and, thus, little margin is left in the low DC potential design at the point B. In this case, compensation of the threshold voltage $V_{th}$ increases the margin in the DC potential design at the point B.

When the semiconductor integrated circuit 100 is fabricated in the process FF, the threshold voltage $V_{th}$ is, for example, equal to 0.50 V, which is lower than the reference threshold voltage. The potential value at the point B of the semiconductor integrated circuit 100 is, for example, equal to 0.24 V. When little margin is left in high DC potential design at the point B, compensation of the threshold voltage $V_{th}$ can increase the margin in the DC potential design at the point B.

Figure 4:
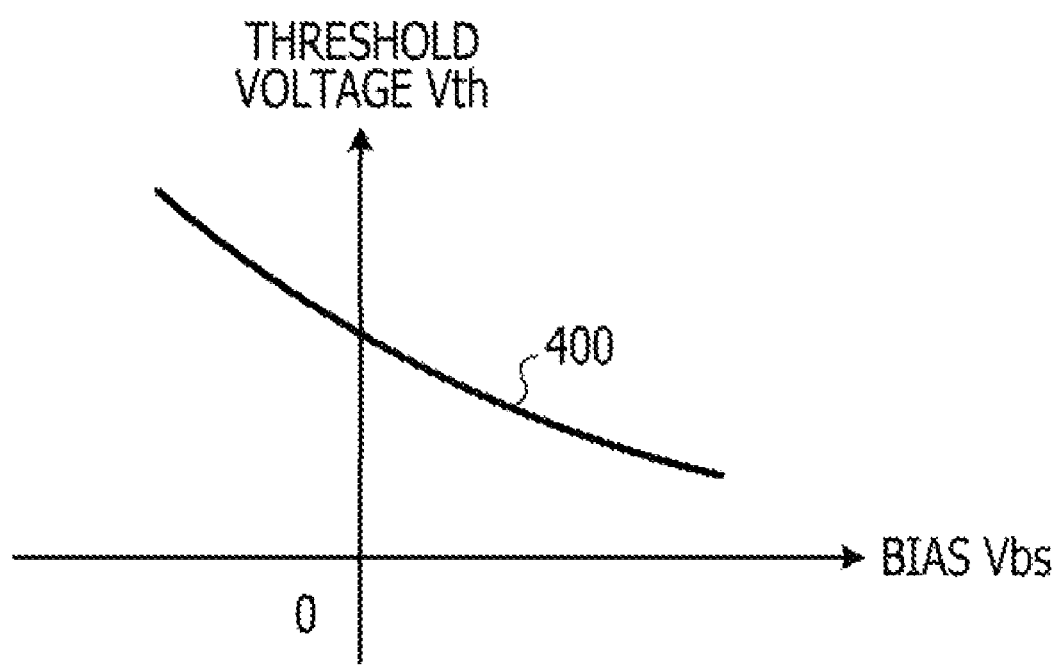
FIG. 4 is a graph illustrating a change in a threshold voltage against a bias applied to a substrate of a transistor.

FIG. 4 is a graph illustrating a change in a threshold voltage against a bias applied to a substrate of a transistor. Referring to FIG. 4, the horizontal axis represents a bias $V_{bs}$ applied to a substrate of each of the transistors 124a and 124b, whereas the vertical axis represents the threshold voltage $V_{th}$ of each of the transistors 124a and 124b. A curve 400 represents a characteristic of the threshold voltage $V_{th}$ against the bias Vbs.

As shown by the curve 400, the threshold voltages $V_{th}$ of the transistors 124a and 124b decrease as the bias $V_{bs}$ applied to the substrates of the transistors 124a and 124b increases, respectively. The threshold voltage $V_{th}$ can be represented by, for example, Equation (2).

$$V_{th} = V_{th\_ref} + \frac{\sqrt{2 \times q \times \varepsilon_s \times N_a}}{2}\left(\sqrt{2\phi_b + V_{bs}} - \sqrt{2\phi_b}\right) \quad (2)$$

In Equation (2), a term $V_{th\_ref}$ represents the threshold voltage $V_{th}$ obtained when no bias is applied to the substrates of the transistors 124a and 124b. Additionally, "q", "ε$_s$", "N$_a$", "Co", and "2φ b" represent an elementary charge, a dielectric constant of a semiconductor, an impurity concentration, an oxide film capacity per a unit area, and a surface potential for inversion, respectively. Here, "q" and "ε$_s$" are constants, whereas "N$_a$", "Co", and "2φ b" are determined in a fabrication process of the transistors 124a and 124b.

Figure 5:
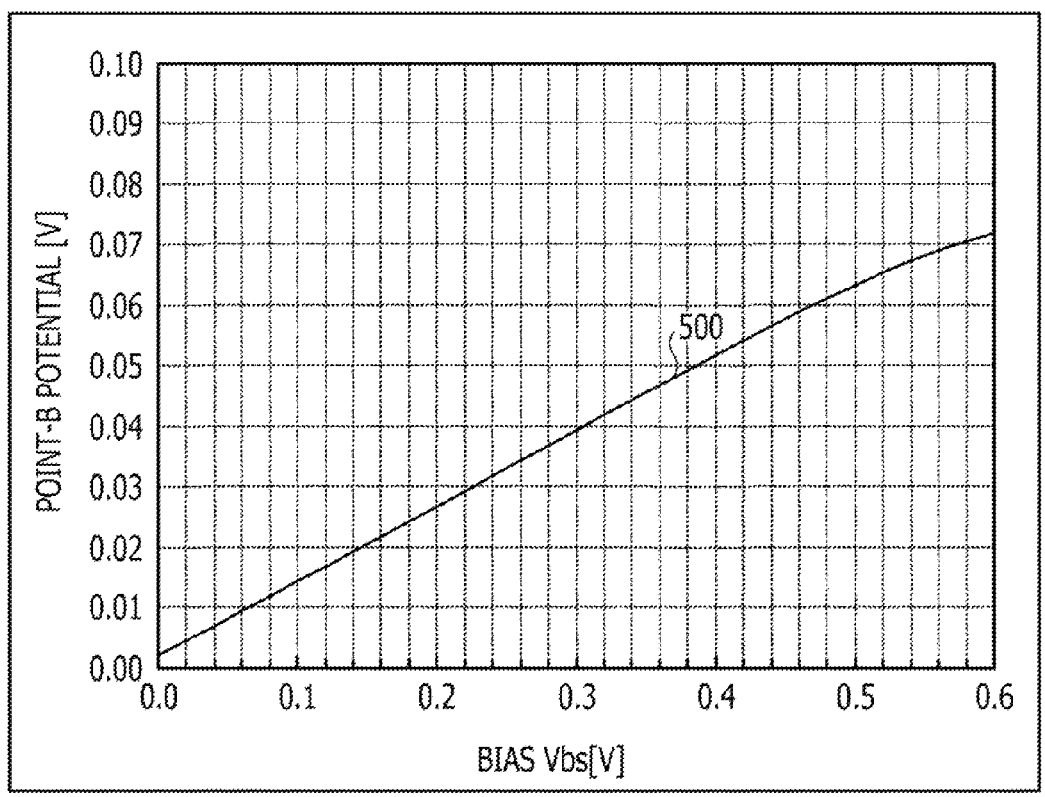
FIG. 5 is a graph illustrating a change in a potential at a point B illustrated in FIG. 1 against a bias.

FIG. 5 is a graph illustrating a change in the potential at the point B illustrated in FIG. 1 against a bias. Referring to FIG. 5, the horizontal axis represents the bias $V_{bs}$ [V] applied to the substrate of each of the transistors 124a and 124b, whereas the vertical axis represents the potential at the point B (point-B potential) [V] of the semiconductor integrated circuit 100 illustrated in FIG. 1. A curve 500 represents a characteristic of the point-B potential against the bias $V_{bs}$ when the semiconductor integrated circuit 100 is fabricated in the process SS (where, e.g., the threshold voltage Vth2=0.74 V).

As illustrated by the curve 500, the point-B potential is nearly equal to 0 V when the bias $V_{bs}$ is equal to 0 V. However, by setting the bias $V_{bs}$ approximately equal to, for example, 0.6 V, the point-B potential can be set approximately equal to 0.07 V. In this manner, the margin can be increased in the DC potential design at the point B.

Figure 6:
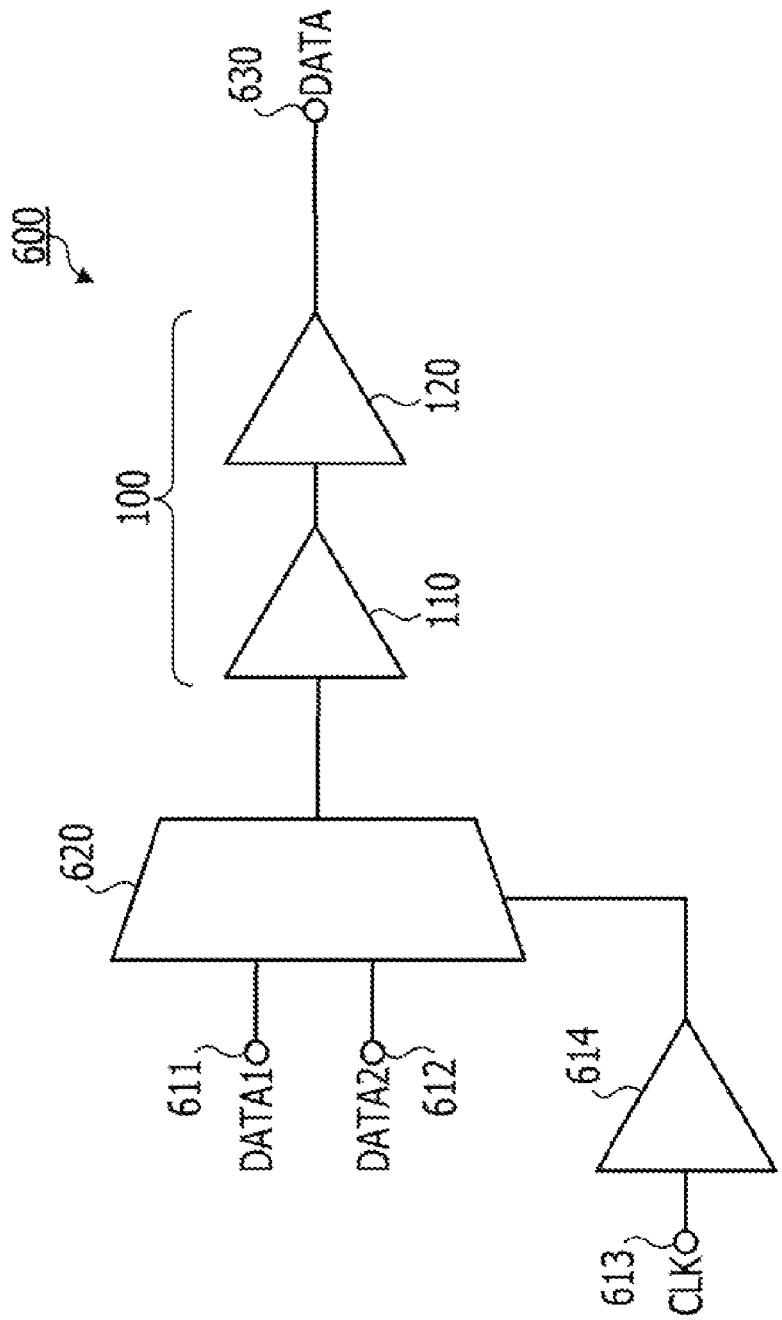
FIG. 6 is a diagram illustrating an example of a parallel/serial converter including the semiconductor integrated circuit illustrated in FIG. 1.

FIG. 6 is a diagram illustrating an example of a parallel/serial converter including the semiconductor integrated circuit illustrated in FIG. 1. Like reference characters are attached to configurations similar to those illustrated in FIG. 1 to omit the description. As illustrated in FIG. 6, a parallel/serial converter 600 includes input terminals 611-613, an amplifier circuit 614, a selector 620, the semiconductor integrated circuit 100, and an output terminal 630.

In the following discussion of FIG. 6, for the purposes of illustration, non-limiting examples of signals are mentioned. A 20-Gbps data signal (DATA1) is input to the input terminal 611, whereas a 20-Gbps data signal (DATA2) is input to the input terminal 612. For example, a 20-GHz clock signal (CLK) is input to the input terminal 613. The selector 620 alternately selects and outputs one of the data signals supplied from the input terminals 611 and 612 in synchronization with the clock signal supplied from the input terminal 613.

The data signal output from the selector 620 is input to the first amplifier circuit 110 of the semiconductor integrated circuit 100. The amplifier circuit 614 is connected between the input terminal 613 and the selector 620. The amplifier circuit 614 amplifies the clock signal supplied from the input terminal 613 and outputs the amplified clock signal to the selector 620.

The first amplifier circuit 110 amplifies the supplied data signal and then outputs the amplified data signal to the second amplifier circuit 120. The second amplifier circuit 120 amplifies the data signal supplied from the first amplifier circuit 110 and then outputs the amplified data signal from the output terminal 630. The data signal (DATA) output from the output terminal 630 is of 40 Gbps.

Illustration of the detector circuit 131 and the bias generator circuit 132 (see FIG. 1) of the semiconductor integrated circuit 100 is omitted in FIG. 6. Although the semiconductor integrated circuit 100 is a multi-stage circuit including the first amplifier circuit 110 and the second amplifier circuit 120, a sufficient margin is left in DC potential design by compensating the fluctuation of the threshold voltages of the transistors 124a and 124b due to process variation. Accordingly, power consumption of the semiconductor integrated circuit 100 can be decreased. Additionally, the sufficient margin in the DC potential design of the semiconductor integrated circuit 100 can improve flexibility of DC potential design of the selector 620 disposed on an upstream side of the semiconductor integrated circuit 100.

The semiconductor integrated circuit 100 according to the first embodiment detects the threshold voltages $V_{th}$ of the transistors 124a and 124b and applies the bias generated on the basis of the detection result to substrates of the transistors 124a and 124b, respectively. In this manner, the semiconductor integrated circuit 100 compensates the fluctuation of the threshold voltage $V_{th}$ due to process variation and, eventually, can increase a margin of circuit design.

In a circuit including the transistors 124a and 124b forming cascode configurations as illustrated in FIG. 1, the margin decreases in the low DC potential design. However, the semiconductor integrated circuit 100 can advantageously increase the margin of the circuit design by compensating the fluctuation of the threshold voltage $V_{th}$ due to process variation. Additionally, when the transistors 124a and 124b are included in a downstream-side circuit (i.e., the second amplifier circuit 120) in a multi-stage circuit as illustrated in FIG. 1, the margin decreases in the low DC potential design. However, the semiconductor integrated circuit 100 can advantageously increase the margin of the circuit design by compensating the fluctuation of the threshold voltage $V_{th}$ due to process variation.

Second Embodiment

Figure 7:
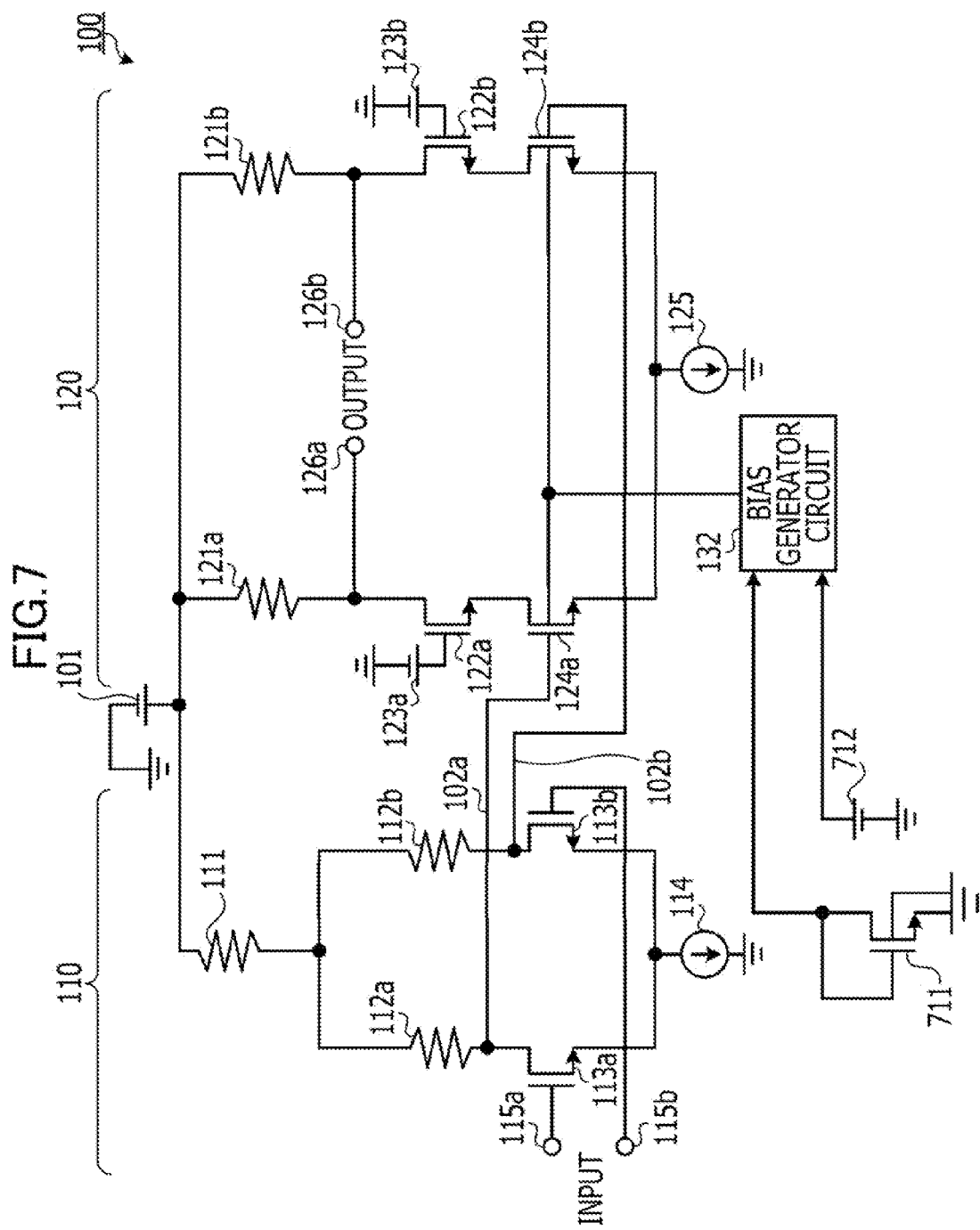
FIG. 7 is a circuit diagram illustrating a semiconductor integrated circuit according to a second example embodiment of the invention.

FIG. 7 is a circuit diagram illustrating a semiconductor integrated circuit according to a second embodiment. In FIG. 7, like reference characters are attached to configurations similar to those illustrated in FIG. 1 to omit the description. As illustrated in FIG. 7, a semiconductor integrated circuit 100 according to the second embodiment includes a monitor transistor 711 functioning as the detector circuit 131 illustrated in FIG. 1 and a power supply 712.

The monitor transistor 711 monitors a threshold voltage $V_{th}$ of each of transistors 124a and 124b. The monitor transistor 711 may be, for example, a MOS transistor having substantially the same current density as the transistors 124a and 124b. The monitor transistor 711 is formed on a chip that includes the transistors 124a and 124b. Additionally, a substrate of the monitor transistor 711 is connected to ground.

Accordingly, the monitor transistor 711 has a threshold voltage equal to the threshold voltages $V_{th}$ of the transistors 124a and 124b obtained when no bias is applied to the substrates thereof. A source of the monitor transistor 711 is connected to ground. A gate of the monitor transistor 711 is connected to a drain of the monitor transistor 711. The drain of the monitor transistor 711 is connected to a bias generator circuit 132. Thus, the threshold voltage of the monitor transistor 711 is output to the bias generator circuit 132.

The power supply 712 outputs, to the bias generator circuit 132, a reference voltage $V_{th}$ representing an idealized threshold voltage for each of the transistors 124a and 124b that would result from a process without process variation. The bias generator circuit 132 calculates and generates a bias on the basis of the threshold voltage output from the drain of the monitor transistor 711 and the reference voltage output from the power supply 712. For example, the bias generator circuit 132 calculates the bias using Equation (3) based on Equation (2).

$$V_{bs} = \frac{\{(V_{thi} - 2\phi_b)^2 - (V_{th\_ref} - 2\phi_b)^2\}}{2 \times q \times \varepsilon_s \times \frac{N_a}{Co^2}} \quad (3)$$

In Equation (3), the bias generator circuit 132 calculates a bias $V_{bs}$ using the reference voltage $V_{th\_ref}$ output from the power supply 712 and the threshold voltage $V_{thi}$ output from the drain of the monitor transistor 711. In this manner, the bias generator circuit 132 can generate the bias $V_{bs}$ for compensating a fluctuation of the threshold voltage $V_{th}$ of each of the transistors 124a and 124b due to process variation.

Figure 8:
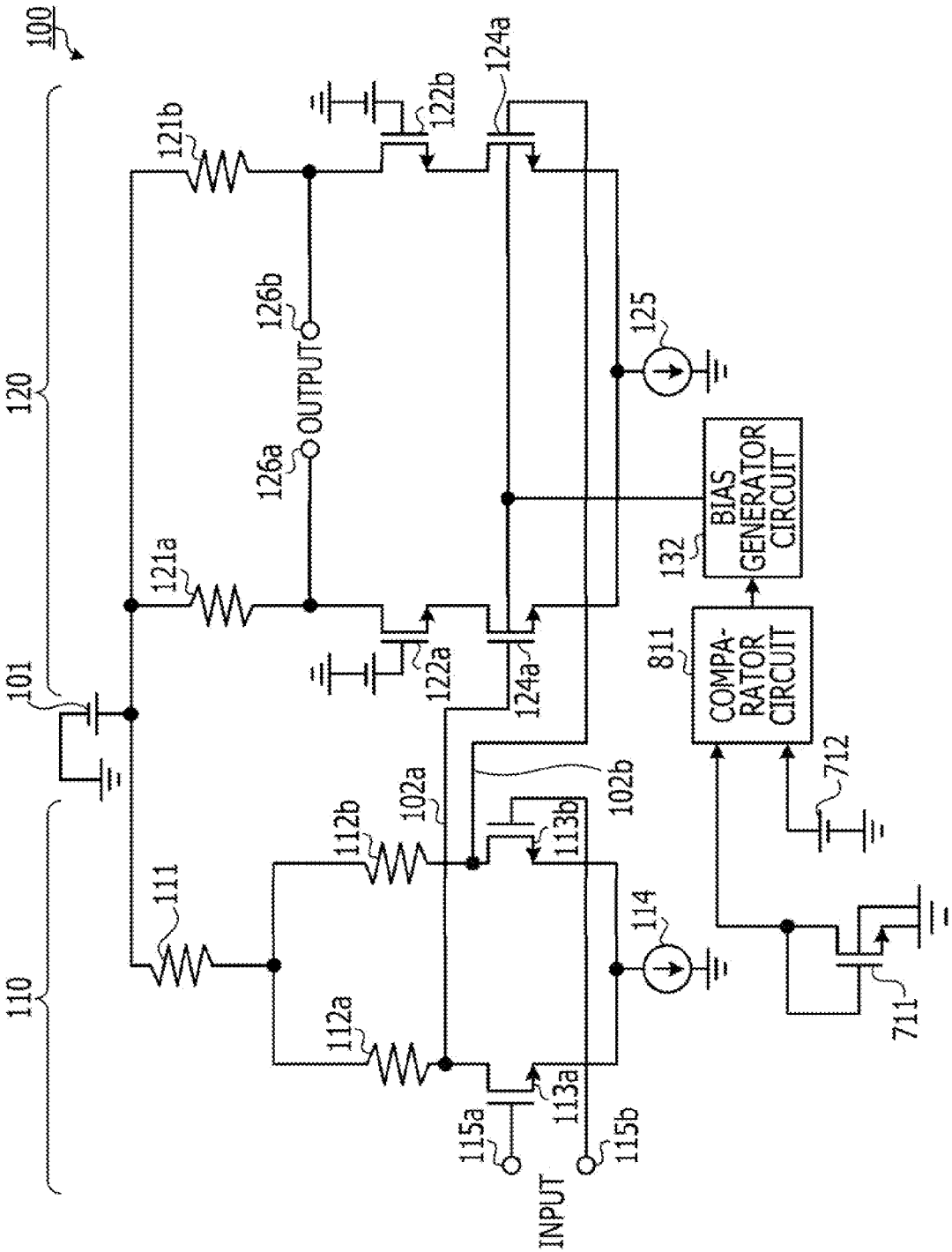
FIG. 8 is a circuit diagram illustrating a modification of the semiconductor integrated circuit illustrated in FIG. 7.

FIG. 8 is a circuit diagram illustrating a modification of the semiconductor integrated circuit illustrated in FIG. 7. In FIG. 8, like reference characters are attached to configurations similar to those illustrated in FIG. 7 to omit the description. As illustrated in FIG. 8, the semiconductor integrated circuit 100 may include a comparator circuit 811 in addition to the components illustrated in FIG. 7. The drain of the monitor transistor 711 is connected to the comparator circuit 811. The power supply 712 outputs the reference voltage to the comparator circuit 811.

The comparator circuit 811 compares the threshold voltage output from the drain of the monitor transistor 711 with the reference voltage output from the power supply 712. Upon determining that the threshold voltage is higher than the reference voltage, the comparator circuit 811 outputs the threshold voltage and the reference voltage to the bias generator circuit 132. Upon determining that the threshold voltage is not higher than the reference voltage, the comparator circuit 811 outputs neither the threshold voltage nor the reference voltage to the bias generator circuit 132.

Accordingly, the bias generator circuit 132 generates the bias if the comparator circuit 811 determines that the threshold voltage is higher than the reference voltage. However, the bias generator circuit 132 does not generate the bias if the comparator circuit 811 determines that the threshold voltage is not higher than the reference voltage. In this manner, the bias can be applied to substrates of the transistors 124a and 124b when the threshold voltages $V_{th}$ of the transistors 124a and 124b are higher than the reference voltage, respectively.

The semiconductor integrated circuit 100 according to the second embodiment generates the bias calculated on the basis of the detected threshold voltage and the reference voltage to accurately compensate the fluctuation of the threshold voltage $V_{th}$ due to process variation, thereby being able to increase a margin of circuit design. Additionally, the semiconductor integrated circuit 100 according to the second embodiment can accurately detect the threshold voltages of the transistors 124a and 124b by detecting the threshold voltage of the monitor transistor 711 included therein.

The monitor transistor 711 has substantially the same current density as the transistors 124a and 124b and is formed on a chip including the transistors 124a and 124b. With such a configuration, the fluctuation of the threshold voltage due to process variation of the transistors 124a and 124b is accurately reflected in the threshold voltage of the monitor transistor 711. Accordingly, the semiconductor integrated circuit 100 can accurately detect the threshold voltages of the transistors 124a and 124b by detecting the threshold voltage of the monitor transistor 711 and, eventually, can accurately compensate the fluctuation of the threshold voltage $V_{th}$ due to process variation.

Third Embodiment

Figure 9:
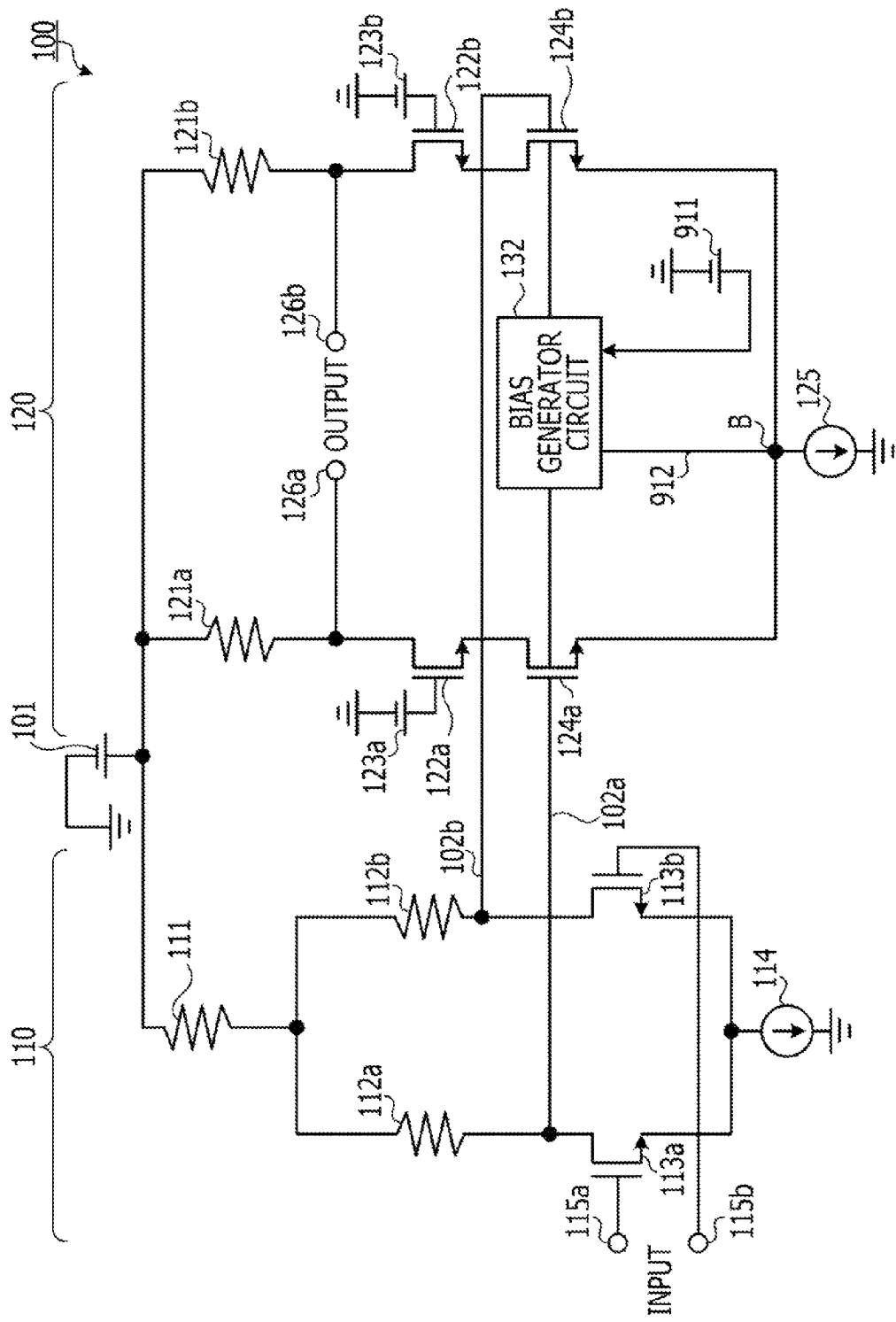
FIG. 9 is a circuit diagram illustrating a semiconductor integrated circuit according to a third example embodiment of the invention.

FIG. 9 is a circuit diagram illustrating a semiconductor integrated circuit according to a third embodiment. In FIG. 9, like reference characters are attached to configurations similar to those illustrated in FIG. 1 to omit the description. As illustrated in FIG. 9, a semiconductor integrated circuit 100 according to the third embodiment includes a power supply 911 and a feedback path 912 in addition to the components illustrated in FIG. 1. The power supply 911 outputs, to a bias generator circuit 132, a reference potential representing an idealized source voltage for each of transistors 124a and 124b that would result from a process without process variation.

The feedback path 912 for feeding a potential at a point B back to the bias generator circuit 132 functions as the detector circuit 131 illustrated in FIG. 1. The feedback path 912 allows the bias generator circuit 132 to acquire the source potential of each of the transistors 124a and 124b. The bias generator circuit 132 generates a bias on the basis of the source potential at the point B acquired from the feedback path 912 and the reference potential output from the power supply 911.

For example, the bias generator circuit 132 generates the bias so that a difference between the source potential and the reference potential decreases. In this manner, the bias generator circuit 132 can generate a bias Vbs for compensating the fluctuation of the threshold voltage Vth of each of the transistors 124a and 124b due to process variation.

Figure 10:
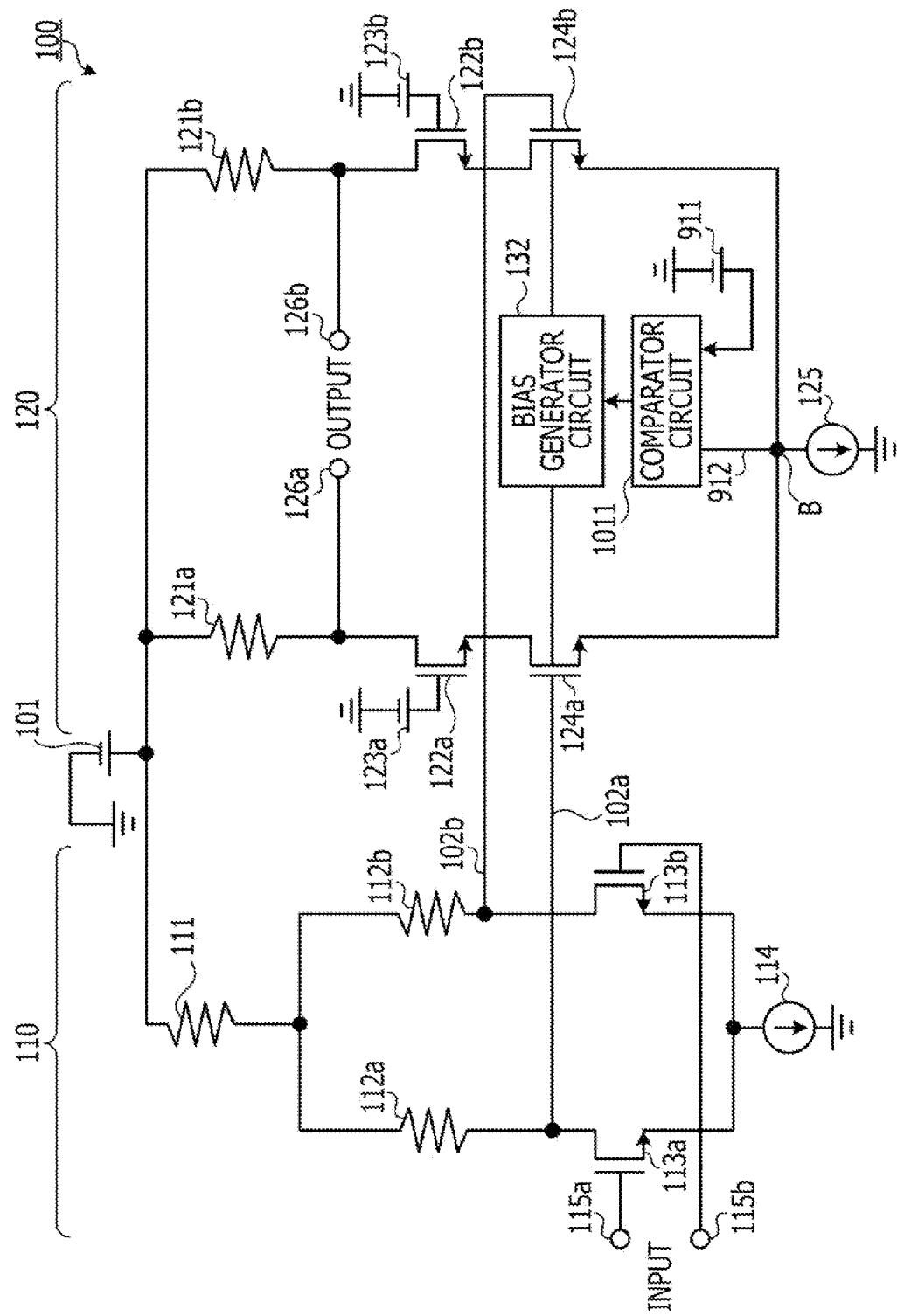
FIG. 10 is a circuit diagram illustrating a modification of the semiconductor integrated circuit illustrated in FIG. 9.

FIG. 10 is a circuit diagram illustrating a modification of the semiconductor integrated circuit illustrated in FIG. 9. In FIG. 10, like reference characters are attached to configurations similar to those illustrated in FIG. 9 to omit the description. As illustrated in FIG. 10, the semiconductor integrated circuit 100 may include a comparator circuit 1011 in addition to the components illustrated in FIG. 9. The feedback path 912 is connected to the comparator circuit 1011. The power supply 911 outputs the reference potential to the comparator circuit 1011.

The comparator circuit 1011 compares the source potential acquired from the feedback path 912 with the reference potential output from the power supply 911. Upon determining that the source potential is higher than the reference potential, the comparator circuit 1011 outputs the source potential and the reference potential to the bias generator circuit 132. Upon determining that the source potential is not higher than the reference potential, the comparator circuit 1011 outputs neither the source potential nor the reference potential to the bias generator circuit 132.

Accordingly, the bias generator circuit 132 generates the bias if the comparator circuit 1011 determines that the source potential is higher than the reference potential. However, the bias generator circuit 132 does not generate the bias if the comparator circuit 1011 determines that the source potential is not higher than the reference potential. In this manner, the bias can be applied to substrates of the transistors 124a and 124b when the threshold voltages $V_{th}$ of the transistors 124a and 124b are higher than the reference voltage, respectively.

The semiconductor integrated circuit 100 according to the third embodiment detects the threshold voltages $V_{th}$ of the transistors 124a and 124b by detecting the source potentials of the transistors 124a and 124b that fluctuate with the threshold voltages $V_{th}$, respectively. In this manner, the threshold voltage $V_{th}$ of each of the transistors 124a and 124b can be accurately detected. The semiconductor integrated circuit 100 according to the third embodiment can accurately compensate the fluctuation of the threshold voltage $V_{th}$ due to process variation by generating the bias on the basis of the detected source potential and the reference potential and, eventually, can increase a margin of circuit design.

(Upper Limit of Substrate Bias)

Figure 11:
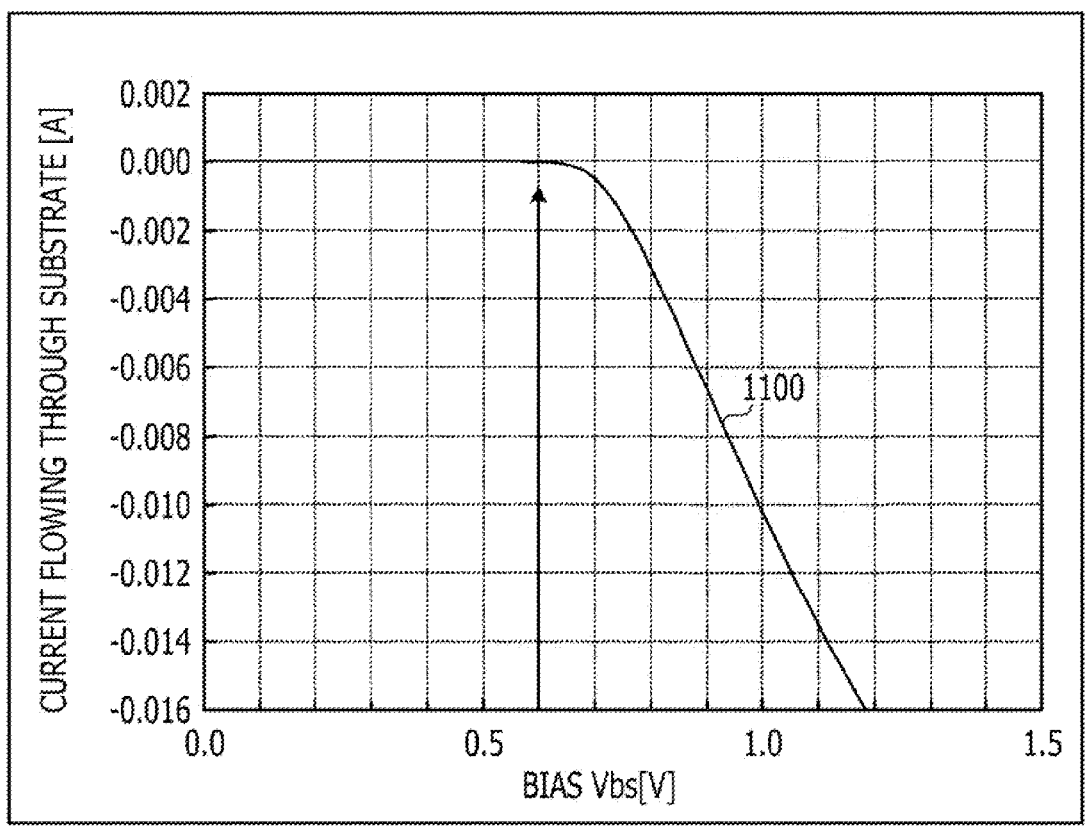
FIG. 11 is a graph illustrating a characteristic of current flowing through a substrate of a transistor against a bias.

FIG. 11 is a graph illustrating a characteristic of current flowing through a substrate of a transistor against a bias. Referring to FIG. 11, the horizontal axis represents a bias $V_{bs}$ [V] applied to the substrates of the transistors 124a and 124b, whereas the vertical axis represents current [A] flowing through the substrates of the transistors 124a and 124b, respectively. A curve 1100 represents a characteristic of current flowing through the substrate of each of the transistors 124a and 124b against the bias Vbs.

For example, it is assumed that threshold voltages of PN junctions of the transistors 124a and 124b are equal to 0.6 V. In this case, as illustrated by the curve 1100, current flows through the substrates of the transistors 124a and 124b if a bias equal to or higher than 0.6 V is applied to the substrates of the transistors 124a and 124b, respectively. When the current flows through the substrates of the transistors 124a and 124b, signals output from the output terminals 126a and 126b deteriorate because of an influence of the current.

Accordingly, the bias generator circuit 132 according to the foregoing embodiments may generate the bias not exceeding the threshold voltages (0.6 V in this example) of the PN junctions of the transistors. The semiconductor integrated circuit 100 can reduce, if not prevent, current from flowing through the substrates of the transistors 124a and 124b by generating the bias not exceeding the threshold voltages of the PN junctions of the transistors 124a and 124b and, eventually, can improve a quality of signals output from the output terminals 126a and 126b, respectively.

(Examples of Other Semiconductor Integrated Circuits)

The transistors 124a and 124b, the detector circuit 131, and the bias generator circuit 132 can be applied not only to the semiconductor integrated circuit 100 but also to various semiconductor integrated circuits involving DC potential design. For example, the transistors 124a and 124b, the detector circuit 131, and the bias generator circuit 132 may be applied to the selector 620 illustrated in FIG. 6 (see FIG. 12).

Figure 12:
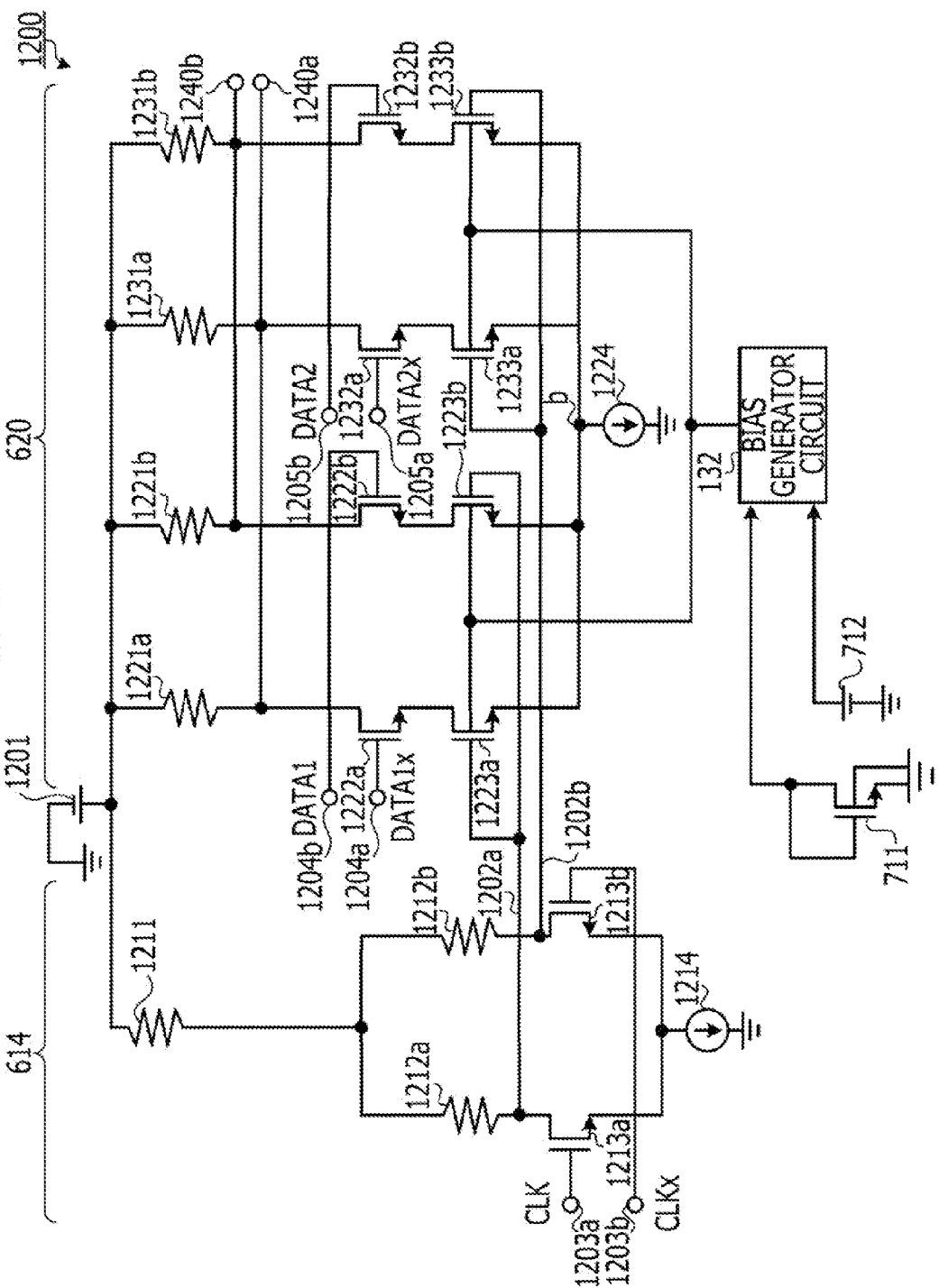
FIG. 12 is a circuit diagram illustrating a first example of other semiconductor integrated circuits.

FIG. 12 is a circuit diagram illustrating a first example of other semiconductor integrated circuits. In FIG. 12, like reference characters are attached to configurations similar to those illustrated in FIG. 1 to omit the description. A semiconductor integrated circuit 1200 illustrated in FIG. 12 includes a power supply 1201, paths 1202a and 1202b, input terminals 1203a, 1203b, 1204a, 1204b, 1205a, and 1205b, output terminals 1240a and 1240b, an amplifier circuit 614, a selector 620, a bias generator circuit 132, a monitor transistor 711, and a power supply 712.

The power supply 1201 supplies voltage to the amplifier circuit 614 and the selector 620. A clock signal amplified by the amplifier circuit 614 is output to the selector 620 through the paths 1202a and 1202b. The input terminals 1203a and 1203b correspond to the input terminal 613 illustrated in FIG. 6. A non-inverted clock signal (CLK) is input to the input terminal 1203a, whereas an inverted clock signal (CLKx) is input to the input terminal 1203b.

The amplifier circuit 614 includes a resistor 1211, resistors 1212a and 1212b, transistors 1213a and 1213b, and a current source 1214. One end of the resistor 1211 is connected to the power supply 1201, whereas the other end thereof is connected to the resistors 1212a and 1212b. One end of the resistor 1212a is connected to the resistor 1211, whereas the other end thereof is connected to a drain of the transistor 1213a. One end of the resistor 1212b is connected to the resistor 1211, whereas the other end thereof is connected to a drain of the transistor 1213b.

The transistors 1213a and 1213b are included in a differential pair. The drain of the transistor 1213a is connected to the resistor 1212a. A source of the transistor 1213a is connected to the current source 1214, whereas a gate of the transistor 1213a is connected to the input terminal 1203a. The drain of the transistor 1213b is connected to the resistor 1212b. A source of the transistor 1213b is connected to the current source 1214, whereas a gate of the transistor 1213b is connected to the input terminal 1203b.

One end of the current source 1214 is connected to the sources of the transistors 1213a and 1213b, whereas the other end thereof is connected to ground. The path 1202a to the selector 620 is connected between the resistor 1212a and the transistor 1213a. The path 1202b to the selector 620 is connected between the resistor 1212b and the transistor 1213b.

The clock signals input from the input terminals 1203a and 1203b are applied to the gates of the transistors 1213a and 1213b, respectively. In accordance with the input clock signals, current from the resistors 1212a and 1212b to the current source 1214 is generated. Accordingly, the amplified clock signals are output to the selector 620 through the paths 1202a and 1202b.

The input terminals 1204a and 1204b correspond to the input terminal 611 illustrated in FIG. 6. A non-inverted data signal (DATA1) is input to the input terminal 1204a, whereas an inverted data signal (DATA1x) is input to the input terminal 1204b. The input terminals 1205a and 1205b correspond to the input terminal 612 illustrated in FIG. 6. A non-inverted data signal (DATA2) is input to the input terminal 1205a, whereas an inverted data signal (DATA2x) is input to the input terminal 1205b.

The selector 620 includes resistors 1221a and 1221b, transistors 1222a, 1222b, 1223a, and 1223b, a current source 1224, resistors 1231a and 1231b, transistors 1232a, 1232b, 1233a, and 1233b, and output terminals 1240a and 1240b.

One end of the resistor 1221a is connected to the power supply 1201, whereas the other end thereof is connected to a drain of the transistor 1222a. One end of the resistor 1221b is connected to the power supply 1201, whereas the other end thereof is connected to a drain of the transistor 1222b.

The transistors 1222a and 1222b are included in a differential pair. The drain of the transistor 1222a is connected to the resistor 1221a. A source of the transistor 1222a is connected to a drain of the transistor 1223a, whereas a gate of the transistor 1222a is connected to the input terminal 1204a. The drain of the transistor 1222b is connected to the resistor 1221b. A source of the transistor 1222b is connected to a drain of the transistor 1223b, whereas a gate of the transistor 1222b is connected to the input terminal 1204b.

The transistors 1223a and 1223b are included in a differential pair. The drain of the transistor 1223a is connected to the source of the transistor 1222a. A source of the transistor 1223a is connected to the current source 1224, whereas a gate of the transistor 1223a is connected to the path 1202a. The drain of the transistor 1223b is connected to the source of the transistor 1222b. A source of the transistor 1223b is connected to the current source 1224, whereas a gate of the transistor 1223b is connected to the path 1202a.

One end of the resistor 1231a is connected to the power supply 1201, whereas the other end thereof is connected to a drain of the transistor 1232a. One end of the resistor 1231b is connected to the power supply 1201, whereas the other end thereof is connected to a drain of the transistor 1232b.

The transistors 1232a and 1232b are included in a differential pair. The drain of the transistor 1232a is connected to the resistor 1231a. A source of the transistor 1232a is connected to a drain of the transistor 1233a, whereas a gate of the transistor 1232a is connected to the input terminal 1205a. The drain of the transistor 1232b is connected to the resistor 1231b. A source of the transistor 1232b is connected to a drain of the transistor 1233b, whereas a gate of the transistor 1232b is connected to the input terminal 1205b.

The transistors 1233a and 1233b are included in a differential pair. The drain of the transistor 1233a is connected to the source of the transistor 1232a. A source of the transistor 1233a is connected to the current source 1224, whereas a gate of the transistor 1233a is connected to the path 1202b. The drain of the transistor 1233b is connected to the source of the transistor 1232b. A source of the transistor 1233b is connected to the current source 1224, whereas a gate of the transistor 1233b is connected to the path 1202b.

Each of the transistors 1223a, 1223b, 1233a, and 1233b may be, for example, a MOS transistor. Each of the transistors 1213a, 1213b, 1222a, 1222b, 1232a, and 1232b may also be, for example, a MOS transistor. A bias (substrate bias) output from the bias generator circuit 132 is applied to a substrate of each of the transistors 1223a, 1223b, 1233a, and 1233b.

The output terminal 1240a is connected between the resistor 1221a and the drain of the transistor 1222a and between the resistor 1231a and the drain of the transistor 1232a. The output terminal 1240b is connected between the resistor 1221b and the drain of the transistor 1222b and between the resistor 1231b and the drain of the transistor 1232b.

The non-inverted clock signal (CLK) output from the amplifier circuit 614 through the path 1202a is applied to the gates of the transistors 1223a and 1223b. The data signals (DATA1 and DATA1x) input from the input terminals 1204a and 1204b are applied to the gates of the transistors 1222a and 1222b, respectively. In accordance with the non-inverted clock signal (CLK) and the data signals (DATA1 and DATA1x), current from the resistors 1221a and 1221b to the current source 1224 is generated.

The inverted clock signal (CLKx) output from the amplifier circuit 614 through the path 1202b is applied to the gates of the transistors 1233a and 1233b. The data signals (DATA2 and DATA2x) input from the input terminals 1205a and 1205b are applied to the gates of the transistors 1232a and 1232b, respectively. In accordance with the inverted clock signal (CLKx) and the data signals (DATA2 and DATA2x), current from the resistors 1231a and 1231b to the current source 1224 is generated.

Accordingly, the data signals (DATA1 and DATA1x) are output from the output terminals 1240a and 1240b in synchronization with the non-inverted clock signal (CLK), respectively. The data signals (DATA2 and DATA2x) are output from the output terminals 1240a and 1240b in synchronization with the inverted clock signal (CLKx), respectively. In this manner, the selector 620 alternately selects and outputs one of the pair of data signals input from the input terminals 1204a and 1204b and the pair of data signals input from the input terminals 1205a and 1205b in synchronization with the clock signals (CLK and CLKx) input from the input terminals 1203a and 1203b, respectively.

The selector 620 includes two stages, namely, one stage including the transistors 1222a and 1222b and the other stage including the transistors 1223a and 1223b. Accordingly, in the semiconductor integrated circuit 1200, a fluctuation of threshold voltages $V_{th}$ of the transistors 1223a, 1223b, 1233a, and 1233b due to process variation decreases a margin in DC potential design at a point b (between the current source 1224 and the transistors 1223a, 1223b, 1233a, and 1233b).

For example, if the threshold voltage $V_{th}$ of each of the transistors 1223a and 1223b increases because of process variation, a potential at the point b approaches 0 V, and voltage for driving the current source 1224 becomes insufficient. Accordingly, the DC potential design of the selector 620 fails.

However, in the semiconductor integrated circuit 1200, the monitor transistor 711 and the bias generator circuit 132 compensate the fluctuation of the threshold voltage $V_{th}$ of each of the transistors 1223a, 1223b, 1233a, and 1233b due to process variation. More specifically, the monitor transistor 711 detects the threshold voltage of each of the transistors 1223a, 1223b, 1233a, and 1233b.

The monitor transistor 711 monitors the threshold voltage $V_{th}$ of each of the transistors 1223a, 1223b, 1233a, and 1233b. The monitor transistor 711 may be, for example, a MOS transistor having substantially the same current density as the transistors 1223a, 1223b, 1233a, and 1233b. The monitor transistor 711 is formed on a chip including the transistors 1223a, 1223b, 1233a, and 1233b.

The bias output from the bias generator circuit 132 is applied to a substrate of each of the transistors 1223a, 1223b, 1233a, and 1233b. In this manner, the fluctuation of the threshold voltage $V_{th}$ due to process variation of the transistors 1223a, 1223b, 1233a, and 1233b can be compensated. Accordingly, the semiconductor integrated circuit 1200 can increase the margin in the DC potential design at the point b, for example. The transistors 1223a and 1223b correspond to, for example, the transistors 124a and 124b illustrated in FIG. 1, respectively. Additionally, the transistors 1233a and 1233b correspond to the transistors 124a and 124b, respectively.

Figure 13:
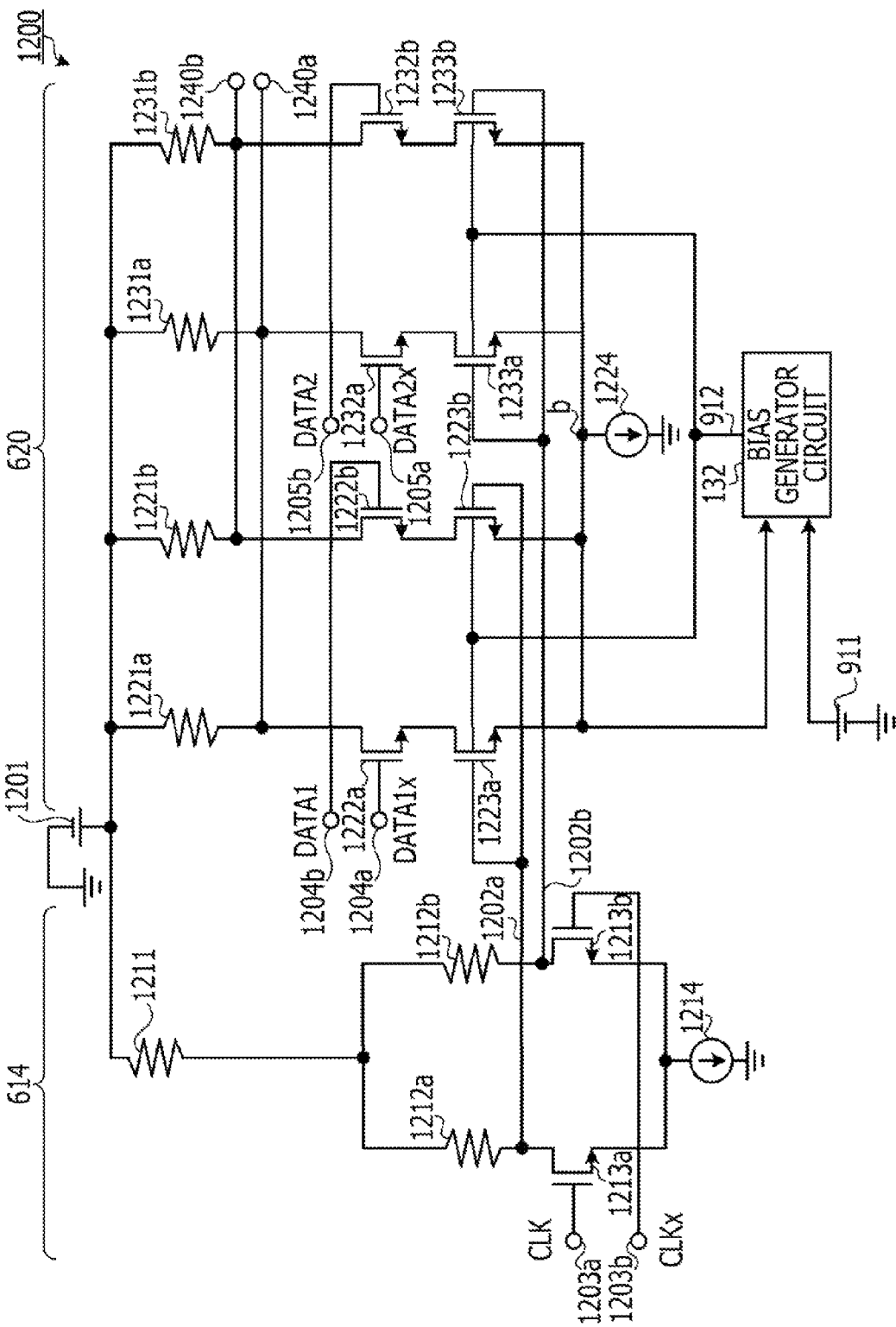
FIG. 13 is a circuit diagram illustrating a second example of other semiconductor integrated circuits.

FIG. 13 is a circuit diagram illustrating a second example of other semiconductor integrated circuits. In FIG. 13, like reference characters are attached to configurations similar to those illustrated in FIG. 12 to omit the description. A semiconductor integrated circuit 1200 illustrated in FIG. 13 corresponds to the semiconductor integrated circuit 1200 illustrated in FIG. 12 further including the power supply 911 and the feedback path 912 illustrated in FIG. 9.

The power supply 911 outputs, to the bias generator circuit 132, a source potential (reference potential) of each of the transistors 1223a, 1223b, 1233a, and 1233b resulting from a process without process variation.

The potential at the point b of the semiconductor integrated circuit 1200 is fed back to the bias generator circuit 132 through the feedback path 912. The bias generator circuit 132 generates a bias so that a difference between the source potential and the reference potential decreases. In this manner, the bias generator circuit 132 can generate a bias $V_{bs}$ for compensating the fluctuation of the threshold voltage $V_{th}$ of each of the transistors 1223a, 1223b, 1233a, and 1233b due to process variation.

As described above, the semiconductor integrated circuits can increase a margin of circuit design.

Advantageously, the disclosed semiconductor integrated circuits can provide a benefit of increasing a margin of circuit design.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the invention have been described in detail, it should be understood that the various changes, substitutions, and alterations could be made hereto without departing from the spirit and scope of the invention.

What is claimed is:

1. A semiconductor integrated circuit comprising:
a first differential amplifier circuit to include a common register and a first register and a second register, the common register being connected to the first register and the second register;
a cascode circuit to include transistors in a cascode connection, a bias being applied to a substrate of the transistors;
a second differential amplifier circuit to include a pair of the transistors to amplify a differential signal taken-out between the first register and the second register, a bias being applied to gates of the transistors via the common register and the first register, and the common register and the second register, respectively;
a detector circuit to generate a signal related to a threshold voltage of at least one of the transistors; and
a bias generator circuit to generate the bias based on the signal generated by the detector circuit.

2. The semiconductor integrated circuit according to claim 1, wherein
the transistors are metal oxide semiconductor (MOS) transistors.

3. The semiconductor integrated circuit according to claim 1, wherein
the bias generator circuit generates the bias based on both the signal generated by the detector circuit and a reference voltage for the transistors.

4. The semiconductor integrated circuit according to claim 2, wherein
the detector circuit includes a monitor transistor that is disposed on the same chip as the transistors and has substantially the same current density as the transistors, and
the detector circuit is further operable to detect a threshold voltage of the monitor transistor.

5. The semiconductor integrated circuit according to claim 4, further comprising:
a comparator circuit to compare the threshold voltage of the monitor transistor with the reference voltage, wherein
the bias generator circuit is further operable to generate the bias when the comparator circuit determines that the threshold voltage is higher than the reference voltage.

6. The semiconductor integrated circuit according to claim 2, wherein
the bias generator is connected to a source of the transistors, and
the detector circuit is further operable to detect a voltage-potential of the sources of the transistors.

7. The semiconductor integrated circuit according to claim 6, wherein the bias generator circuit is further operable to generate the bias on the basis of the voltage-potential of the sources detected by the detector circuit and a reference-potential for the transistors.

8. The semiconductor integrated circuit according to claim 7, wherein
the bias generator circuit is further operable to generate the bias so as to decrease a difference between the source potential and the reference-potential.

9. The semiconductor integrated circuit according to claim 7, further comprising:
a comparator circuit to compare the voltage-potential of the sources with the reference-potential, wherein
the bias generator circuit is further operable to generate the bias when the comparator circuit determines that the voltage-potential of the sources is higher than the reference-potential, whereas the bias generator circuit is further operable to not generate the bias when the comparator circuit determines that the voltage-potential of the sources is equal to or lower than the reference-potential.

10. The semiconductor integrated circuit according to claim 1, wherein
the bias generator circuit is further operable to generate the bias to be equal to or lower than a threshold voltage of a PN junction of the transistors.

11. The semiconductor integrated circuit according to claim 1, wherein
the transistors are included in a downstream-side circuit in a multi-stage circuit.

12. A semiconductor integrated circuit comprising:
a first differential amplifier circuit to include a common register and a first register and a second register, the common register being connected to the first register and the second register;
a cascode circuit to include a first transistor and a second transistor in cascode connection, a bias being applied to a substrate of the second transistor;
a second differential amplifier circuit to include a pair of the first and second transistors to amplify a differential signal taken-out between the first register and the second register, a bias being applied to gates of the transistors via the common register and the first register, and the common register and the second register, respectively;
a detector circuit to indirectly detect a threshold voltage of the second transistor and to provide a signal indicative thereof; and
a bias generator circuit to generate the bias based on the signal generated by the detector circuit.

13. The semiconductor integrated circuit according to claim 12, wherein
the detector circuit includes a monitor transistor that has substantially the same current density as the second transistor and is formed on the same chip as the second transistor in a location sufficiently proximal to the second transistor such that the monitor transistor can be regarded as having been formed according to substantially the same process variations which formed the second transistor, and
the detector circuit is further operable to directly detect a threshold voltage of the monitor transistor, the indirectly detected threshold voltage of the second transistor being represented by the directly detected threshold voltage of the monitor transistor.

* * * * *